United States Patent [19]

Bulat et al.

[11] Patent Number: 4,713,358

[45] Date of Patent: Dec. 15, 1987

[54] METHOD OF FABRICATING RECESSED GATE STATIC INDUCTION TRANSISTORS

[75] Inventors: Emel S. Bulat, Framingham; Brian M. Ditchek, Milford; Scott J. Butler, Rochdale, all of Mass.

[73] Assignee: GTE Laboratories Incorporated, Waltham, Mass.

[21] Appl. No.: 858,762

[22] Filed: May 2, 1986

[51] Int. Cl.⁴ .................. H01L 21/283; H01L 21/265
[52] U.S. Cl. ......................................... 437/65; 437/6; 437/200; 437/41; 437/911; 357/22
[58] Field of Search .................... 29/576 W, 571, 590, 29/591, 578, 580; 357/22, 23; 427/93, 53.1, 6, 41, 65, 200, 203, DIG. 911

[56] References Cited

U.S. PATENT DOCUMENTS

| 4,199,771 | 4/1980 | Nishizawa et al. | 357/22 |
| 4,326,209 | 4/1982 | Nishizawa et al. | 357/22 |
| 4,466,173 | 8/1984 | Baliga | 29/571 |
| 4,476,622 | 10/1984 | Cogan | 29/571 |
| 4,522,845 | 6/1985 | Powell et al. | 427/53.1 |
| 4,543,706 | 10/1985 | Bencuya et al. | 29/571 |
| 4,587,712 | 5/1986 | Baliga | 29/571 |
| 4,589,193 | 5/1986 | Goth et al. | 29/576 W |

FOREIGN PATENT DOCUMENTS 2026237 1/1980 United Kingdom .

OTHER PUBLICATIONS

Murarka, S. P., "Refractory Silicides for Integrated Circuits", in *J. Vac. Sci. Technol.*, vol. 17, No. 4, Jul.-/Aug. 1980, pp. 775-791.

Cogan et al., "High Performance Microwave Static Induction Transistors", in *IEDM*, 1983, pp. 221-224.
Swirlun et al., "Contact Resistance of LPCVD W/Al and PtSi/W/Al Metallization", in IEEE Elec. Dev. Lett., vol. EDL-5, Jun. 84, pp. 209-211.
Bartur et al., "Utilization of NiSi₂ as an Interconnect Material", in *IEEE Electron Device Letters*, vol. EDL-5, No. 3, pp. 88-90, 3/84.

*Primary Examiner*—Brian E. Hearn
*Assistant Examiner*—T. N. Quach
*Attorney, Agent, or Firm*—David M. Keay

[57] ABSTRACT

A low resistivity N-type layer is formed at the surface of a high resistivity N-type epitaxial layer which has been grown on a low resistivity N-type substrate of silicon. Parallel grooves are etched through the low resistivity N-type layer into the high resistivity N-type layer forming interposed ridges of silicon. When fabricating junction gate devices, P-type zones are formed at the end walls of the grooves by ion implantation. A layer of silicon oxide is formed on the side walls of the grooves exposing the silicon at the end walls of the grooves and at the surfaces of the ridges. A layer of a silicide-forming metal, specifically cobalt, is deposited. A rapid thermal annealing treatment is performed which causes the cobalt to react with the silicon and form cobalt silicide at the cobalt-silicon interfaces. The cobalt does not react with the silicon oxide at the side walls of the grooves. The unreacted cobalt is removed by an etching solution which does not attack the cobalt silicide. Metal layers are placed on the cobalt silicide to increase its conductivity as contact members.

14 Claims, 8 Drawing Figures

METHOD OF FABRICATING RECESSED GATE STATIC INDUCTION TRANSISTORS

BACKGROUND OF THE INVENTION

This invention relates to semiconductor devices. More particularly, it is concerned with methods of fabricating semiconductor devices having recessed gate structures.

The static induction transistor is a field effect semiconductor device capable of operation at relatively high frequency and power. These transistors are characterized by a short, high resistivity semiconductor channel region which may be controllably depleted of carriers. The current-voltage characteristics of the static induction transistor are generally similar to those of a vacuum tube triode. These devices are described by Nishizawa et al. in U.S. Pat. No. 3,828,230 issued Aug. 6, 1974, and in U.S. Pat. No. 4,199,771 issued Apr. 22, 1980.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, the source-drain current and voltage derived from an attached energy source will also vary.

Recessed gate static induction transistors which have improved characteristics are described in United Kingdom Pat. application No. 2,026,237 which was published on Jan. 30, 1980, and in an article "High Performance Microwave Static Induction Transistors" by Cogan et al published in the proceedings of the International Electron Devices Meeting (IEEE) Dec. 5, 6, and 7, 1983, Washington D.C., Paper 9.5, pages 221–224.

In fabricating recessed gate devices the gate regions are formed at the bottoms or end walls of grooves or trenches in the body of silicon material. Metal contacts are applied to the gate regions at the end walls of the grooves in order to make electrical connection thereto. Typically a layer of metal, for example aluminum, is deposited, and then selectively removed to leave metal contacts in the desired pattern. It has been difficult, however, to apply the metal and then remove it so that the metalization at the end walls of the grooves is satisfactory and no metal remains on the side walls of the grooves.

SUMMARY OF THE INVENTION

The improved method of fabricating a semiconductor device in accordance with the present invention produces contacts at the end walls of the grooves without unwanted metalization on the side walls of the grooves. In accordance with the method a body of silicon is provided which includes a first layer of silicon of one conductivity type of relatively low resistivity, a second layer of silicon of the one conductivity type of relatively high resistivity contiguous with the first layer, and a third layer of silicon of the one conductivity type of relatively low resistivity contiguous with the second layer. The first layer has a surface at a surface of the body. A plurality of parallel grooves are formed in the body of silicon thus providing a plurality of interposed ridges. The grooves extend through the first layer of silicon into the second layer of silicon. Each of the grooves has side walls formed by the adjacent ridges of silicon and an end wall. A layer of silicon oxide is formed on the side walls of the grooves and both the second layer of silicon at the end walls of the grooves and the first layer of silicon at the surfaces of the ridges are exposed. A silicide-forming metal is deposited over the silicon oxide on the side walls, over the silicon at the end walls of the grooves, and over the silicon at the surface of the ridges. Then the body is heated to cause the silicide-forming metal to react with the underlying silicon to form metal silicide at the end walls of the grooves and at the surfaces of the ridges. The silicide-forming metal does not react with the underlying silicon oxide layer on the side walls. The unreacted silicide-forming metal overlying the silicon oxide layer on the side walls is then removed while leaving the metal silicide at the end walls of the grooves and at the surfaces of the ridges.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION

In fabricating junction field effect transistors of the static induction type in accordance with the invention as illustrated in the figures a substrate of single crystal silicon of one conductivity type is provided as a supporting structure. As is well-understood the substrate is usually a slice or wafer of relatively large surface area upon which many identical devices are fabricated simultaneously. However, for purposes of illustration the fabrication of only a portion of a single static induction transistor in a fragment of a slice will be shown and described.

Figure 1:
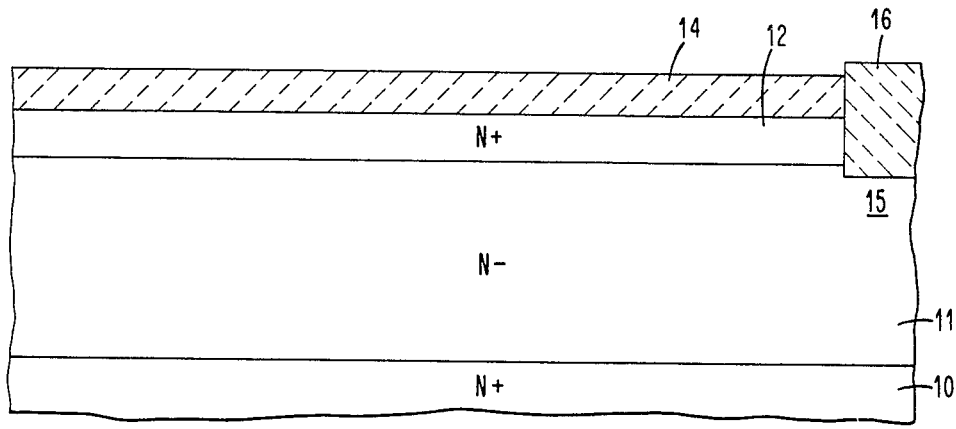
FIGS. 1 through 8 are a series of elevational views in cross-section of a fragment of a wafer of silicon illustrating successive steps in the fabrication of a junction field effect transistor of the static induction type in accordance with the present invention.

A slice or wafer of N-type silicon of uniform relatively low resistivity having flat, planar, parallel opposed major surfaces, a fragment 10 of which is shown in FIG. 1, is produced by any of the known techniques of crystal fabrication including appropriate slicing and cleaning operations.

An epitaxial layer 11 of N-type silicon of uniform relatively high resistivity is grown on the surface of the substrate as by known vapor deposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer.

The surface of the wafer is covered with an adherent protective layer of silicon nitride. As is well-known in the art a thin buffer layer of silicon dioxide is first formed on the surface of the wafer to reduce thermal mismatch effects. Then, as illustrated in FIG. 1, portions of the silicon oxide-silicon nitride layer 14 are removed by employing known photoresist masking and etching procedures to expose sections 15 of the silicon body in the field region which lies outside of the section which is the active device region to be utilized for fabricating a device structure. The wafer is treated in the presence of oxygen at an elevated temperature to cause the exposed silicon to be converted to silicon oxide and thus to grow a protective layer of field oxide 16 in the sections 15 of the wafer outside the section protected by silicon nitride in which the device is to be fabricated.

Then the overlying silicon nitride of the layer 14 is removed leaving the underlying silicon oxide. The wafer is treated in accordance with conventional techniques to implant N-type conductivity imparting material, for example arsenic, into a layer at the surface of the epitaxial layer 11 to form a layer 12 heavily doped with the N-type conductivity imparting material beneath the thin silicon oxide of the layer 14. The thick field oxide 16 protects the underlying section 15.

Figure 2:
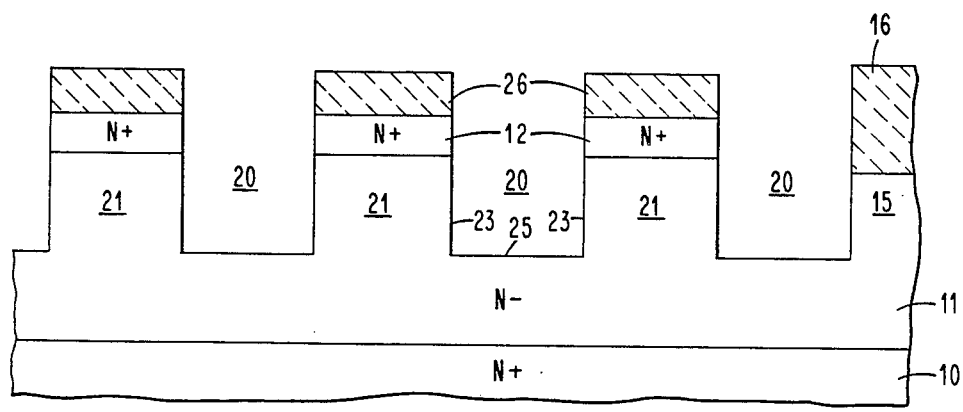

Next a layer of silicon oxide 26 is deposited over the surface of the wafer. By employing standard photoresist masking and etching techniques portions of the silicon oxide layer 26 in the active device region are removed to expose the silicon surface in a pattern of parallel areas. Exposed silicon is removed by employing known anisotropic etching techniques to form a plurality of parallel grooves or trenches 20 leaving interposed between the grooves 20 finger-like ridges 21 of silicon. Each of the grooves 20 has opposite side walls 23 formed by the two adjacent ridges 21 and also a bottom or end wall 25. FIG. 2 illustrates the wafer at this stage in the method.

Figure 3:
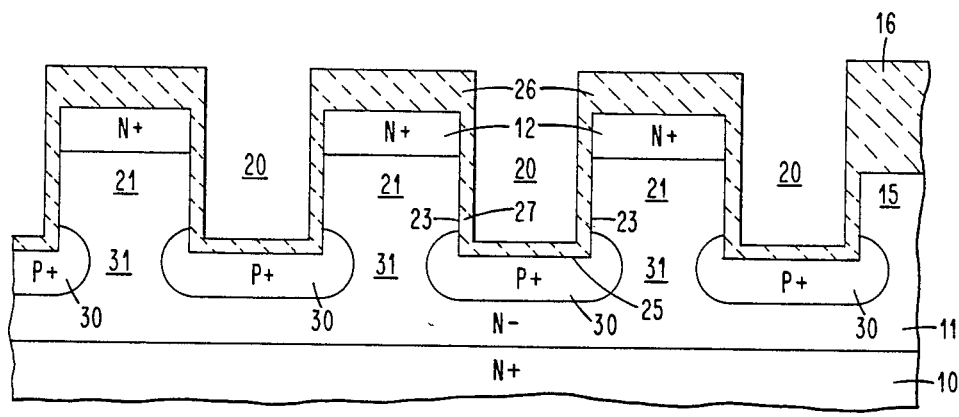

In the fabrication of junction gate static induction transistors the wafer is then exposed to oxygen at an elevated temperature to grow silicon oxide at all the exposed silicon surfaces. Thus, the side walls 23 and the end wall 25 of each of the grooves 20 become coated with an adherent silicon oxide layer 27 as shown in FIG. 3. P-type conductivity imparting material, for example boron, is then introduced into the silicon of relatively high resistivity of the epitaxial layer 11 at the end walls 25 by conventional ion implantation techniques. The ions pass through the thin silicon oxide layer 27 overlying the end walls 25 while the thicker silicon oxide layers 26 and 16 protect the remainder of the silicon wafer. The wafer is heated to cause the implanted material to diffuse into the epitaxial layer 11 from the region of the end walls 25. The P-type conductivity imparting material diffuses laterally as well as vertically. Zones of P-type material 30 are thus produced inset in the high resistivity N-type material of the epitaxial layer 11 as illustrated in FIG. 3.

Figure 4:
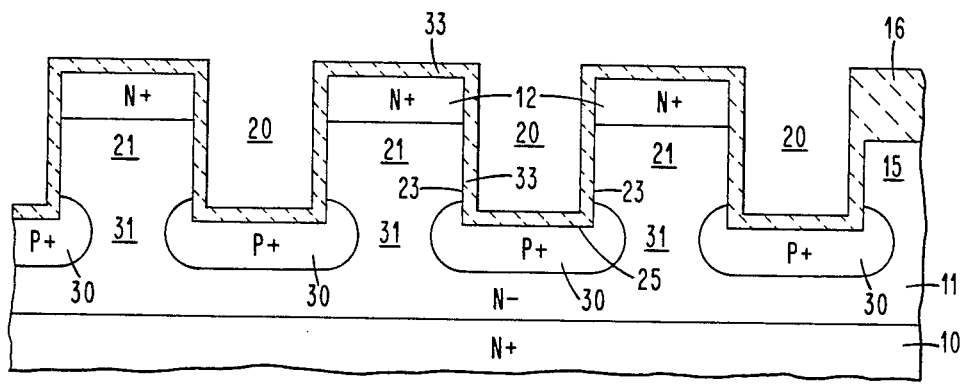

The body is treated by etching in a suitable etching solution which dissolves silicon oxide. The treatment is maintained for a sufficient period to remove all of the silicon oxide layers 26 and 27 overlying the ridges and the side walls and end walls of the grooves. The field oxide 16 is also reduced in thickness but no significant amount is removed. After the silicon of the device region is exposed, the wafer is treated by heating in an oxidizing atmosphere to grow a layer of silicon oxide 33 over the surfaces of the ridges 21 and on the side walls 23 and end walls 25 of the grooves 20 as illustrated in FIG. 4.

The wafer is then subjected to etching in conventional reactive ion etching apparatus. As is well understood the reactive ion etching procedure can be adjusted to remove all materials at a substantially equal rate in the vertical direction but does not remove material laterally. Thus, since the silicon oxide layer 16 is relatively thick and the silicon oxide layer 33 on the side walls 23 extends in a vertical direction the silicon oxide of the layer 33 on the horizontally disposed surfaces of the ridges 21 and on the horizontally disposed end wall 25 is removed. The adherent silicon oxide layer 33 at the side walls 23 of the grooves 20 remains essentially intact.

Figure 5:
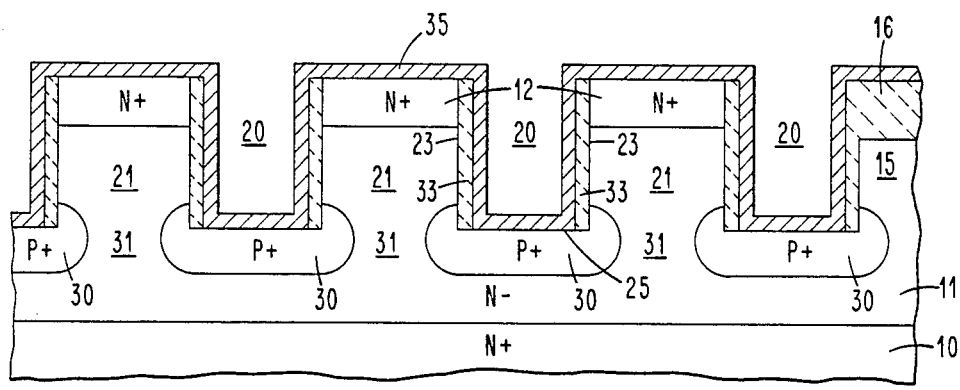

Next, as illustrated in FIG. 5, a layer of a silicide-forming metal 35 is deposited over the entire surface of the wafer. The silicide-forming metal is a metal which reacts with silicon to form a conductive silicide but which does not react with silicon oxide. Although cobalt is a preferred silicide-forming metal for use in the method in accordance with the present invention, other metals which form conductive silicides such as nickel, titanium, tantalum, tungsten, and molybdenum may be used.

The wafer is then subjected to a rapid thermal annealing treatment. That is, the wafer is heated to a high temperature for a short period, of the order of a few seconds. Heat is applied directly from a source of intense energy, such as a laser. This treatment is in contrast to furnace annealing in which a wafer is enclosed in a furnace, the internal temperature of which is raised relatively slowly with the temperature being maintained for a relatively long period of time. The particular temperature and time of rapid thermal annealing is determined by the particular silicide-forming metal employed. For cobalt the wafer is heated at a temperature of from about 700° to about 900° C. for a period of from about 4 to about 40 seconds. More specifically, for a layer 35 of cobalt approximately 60–80 nanometers thick it is preferred that the wafer be heated at a temperature of about 800° C. for about 15 seconds.

Figure 6:
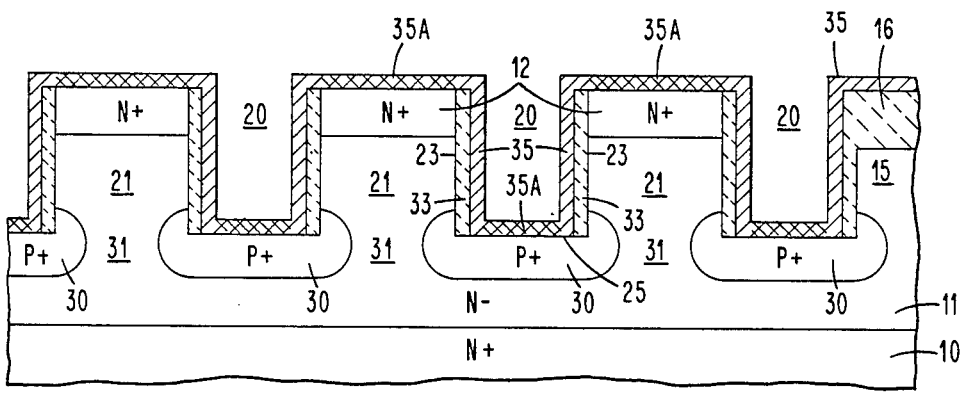

During the rapid thermal annealing treatment the metal and silicon at the metal-silicon interfaces react to form a silicide. The metal adherent to the silicon oxide layer 33 on the side walls 23 of the grooves does not react with the silicon oxide and remains as a metal. The result is illustrated in FIG. 6 which shows the unreacted metal 35 on the silicon oxide layer 33 on the side walls 23 of the grooves 20 and the members of metal silicide 35A overlying the surfaces of the ridges 21 and the end walls 25 of the grooves 20.

Figure 7:
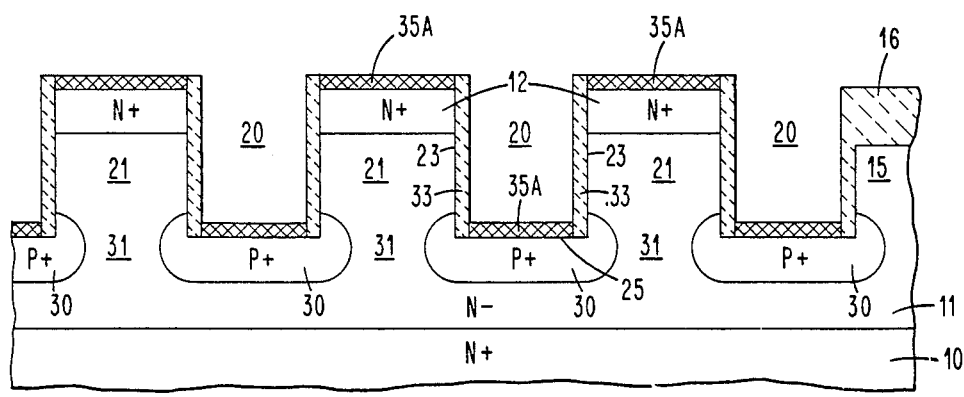

The wafer is then subjected to an etching solution which removes the unreacted metal 35 without disturbing the metal silicide 35A. For cobalt the wafer is placed in a hydrochloric acid/hydrogen peroxide etchant at a temperature of about 25° C. Thus as illustrated in FIG. 7 conductive metal silicide contacts 35A are in ohmic contact with the N-type regions 12 at the surfaces of the ridges 21 and with the P-type zones 30 at the end walls 25 of the grooves. If the devices being fabricated are Schottky gate static induction transistors, there are no P-type zones 30 and the conductive metal silicide contacts 35A at the end walls 25 form Schottky barriers with the N-type silicon of the layer 11. The side walls 23 of the grooves are protected by the silicon oxide coating 33 which is free of any conductive material.

In order to form a conductive path of lowered resistance the contacts 35A are further metalized as by electroplating with a suitable metal 37, for example gold or nickel, or by selective chemical vapor deposition of a conductive metal, such as tungsten. Thus, a thicker, more conductive contact member is formed. In addition as is well known in the art, the bottom surface of the substrate 10 may be appropriately metalized with a metal layer 39 to provide an ohmic contact to the low resistivity N-type silicon of the substrate 10.

Figure 8:
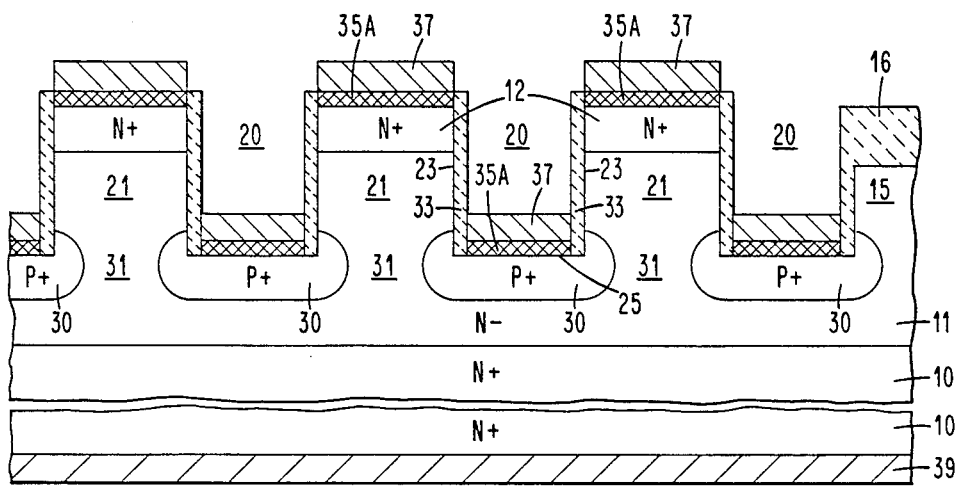

The resulting junction gate static induction transistor as illustrated in FIG. 8 includes source regions 12 of low resistivity N-type silicon in each of the ridges 21 and a drain region of low resistivity N-type silicon provided by the substrate 10. The channel region 31 of high resistivity N-type silicon between each source region 12 and drain region 10 lies between P-type zones 30 which form the gate regions. The gate contacts 35A-37 to the P-type gate regions 30 at the end walls 25 of the grooves 20 are appropriately connected together and to a bonding pad (not shown) in a conventional manner. The source contacts 35A-37 to the N-type source regions 12 at the surfaces of the ridges 21 are similarly connected together and to a bonding pad (not shown).

In the fabrication of an exemplary junction gate static induction transistor structure in accordance with the present invention the substrate 10 may be a slice of single crystal N-type silicon doped with antimony to produce a uniform resistivity of 0.01 to 0.05 ohm-centimeters. The N-type epitaxial layer 11 of relatively high resistivity silicon is doped with arsenic during deposition to provide a uniform resistivity of about 8–15 ohm-centimeters. The epitaxial layer 11 may be about 8–12 micrometers thick. Arsenic is implanted by ion implantation to produce the relatively low resistivity N-type surface layer 12.

The grooves 20 are from 2 to 8 micrometers deep and from 2 to 6 micrometers wide. The interposed ridges 21 have a width of from 3 to 8 micrometers. The channel regions between the gate regions 30 are from 0.5 to 4 micrometers wide. The deposited cobalt is approximately 60 to 80 nanometers thick and the layer of metal 40 is from 200 to 800 nanometers thick.

The method as described provides devices having conductive contacts at the end walls of the grooves while the side walls of the grooves are free of any conductive material. The structure of alternating grooves and ridges automatically provides proper alignment for both the gate contacts and the source contacts without precise registration procedures and precision equipment being required. The process avoids the necessity for employing photolithographic techniques in defining and forming the metal contacts. The resolution of elements defined by photolithography becomes degraded with uneven surfaces and becomes unacceptable for defining the metalization in grooves deeper than about 2.5 micrometers. Therefore, this process provides an improved method for the fabricating of recessed gate devices. In addition, the process employs a rapid thermal annealing treatment which produces metal-silicide contacts having excellent conductivity characteristics.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a semiconductor device comprising
   providing a substrate of silicon of one conductivity type of relatively low resistivity having a flat, planar surface;
   growing an epitaxial layer of silicon of the one conductivity type of relatively high resistivity on said surface of the substrate, said epitaxial layer having a flat, planar surface parallel to the interface of the epitaxial layer and the substrate forming a body of silicon;
   introducing conductivity type imparting material of the one conductivity type into said epitaxial layer from said surface to form a layer of silicon of the one conductivity type of relatively low resistivity in said epitaxial layer adjacent to said surface;
   forming a layer of protective material on the surface of the body;
   removing portions of said layer of protective material to expose a plurality of parallel areas of said surface;
   removing silicon at the exposed areas to form a plurality of grooves in said body of silicon providing interposed ridges of silicon having surfaces in said surface of the body, said grooves extending through said layer of silicon of the one conductivity type of relatively low resistivity into the underlying layer of the one conductivity type of relatively high resistivity, each of said grooves having side walls formed by the adjacent ridges of silicon and an end wall;
   introducing conductivity type imparting material of the opposite conductivity type into the silicon at the end walls of said grooves to convert zones of silicon of the one conductivity type of relatively high resistivity to the opposite conductivity type;
   removing all protective material to expose the silicon at the side walls and end walls of said grooves and at the surfaces of said ridges;
   forming a layer of silicon oxide on the side walls and end walls of said grooves and on said surfaces of said ridges;
   removing the layer of silicon oxide from the end walls of said grooves and from said surfaces of said ridges to expose the silicon at said end walls of the grooves and at said surfaces of said ridges while leaving silicon oxide overlying the side walls of said grooves;
   depositing a silicide-forming metal overlying the silicon oxide at the side walls of the grooves, the silicon at the end walls of the grooves, and the silicon at the surfaces of the ridges;
   heating to cause the silicide-forming metal to react with the underlying silicon to form metal silicide in ohmic contact with the silicon at the end walls of the grooves and at the surfaces of the ridges, the silicide-forming metal not reacting with the underlying silicon oxide layer on the side walls; and
   removing the unreacted silicide-forming metal overlying the silicon oxide layer on the side walls while leaving the metal silicide in ohmic contact with the silicon at the end walls of the grooves and at the surfaces of the ridges.

2. The method in accordance with claim 1 wherein heating comprises
   subjecting the wafer to a rapid thermal annealing treatment to cause the silicide-forming metal to react with the underlying silicon at the metal-silicide interfaces to form metal silicide.

3. The method in accordance with claim 2 wherein said silicide-forming metal is selected from the group consisting of cobalt, nickel, titanium, tantalum, tungsten, and molybdenum.

4. The method in accordance with claim 3 wherein said silicide-forming metal is cobalt which reacts with silicon to form cobalt silicide.

5. The method in accordance with claim 4 wherein heating to cause the cobalt to react with the underlying silicon comprises heating at a temperature between 700° C. and 900° C. for a period of from 4 seconds to 40 seconds.

6. The method in accordance with claim 5 wherein cobalt is desposited to form a layer approximately 60 to 80 nanometers thick.

7. The method in accordance with claim 6 including subsequent to removing the unreacted cobalt the step of forming a layer of conductive metal on the cobalt silicide.

8. The method in accordance with claim 1 wherein introducing conductivity type imparting material of the opposite conductivity type into the silicon at the end walls of said grooves includes forming a layer of silicon oxide on the exposed silicon surfaces including the side walls and end walls of said grooves;

ion implanting conductivity the imparting material of the opposite conductivity type through the silicon oxide on the end walls of said grooves and into the silicon at the end walls; and heating to cause the implanted conductivity type imparting material of the opposite conductivity type to diffuse and convert said zones of silicon of the one conductivity type of relatively high resistivity to the opposite conductivity type;

and wherein removing all protective material includes removing all of said layer of silicon oxide.

9. The method in accordance with claim 8 wherein heating comprises subjecting the wafer to a rapid thermal annealing treatment to cause the silicide-forming metal to react with the underlying silicon at the metal-silicon interfaces to form metal silicide.

10. The method in accordance with claim 9 wherein said silicide-forming metal is selected from the group consisting of cobalt, nickel, titanium, tantalum, tungsten, and molybdenum.

11. The method in accordance with claim 10 wherein said silicide-forming metal is cobalt which reacts with silicon to form cobalt silicide.

12. The method in accordance with claim 11 wherein heating to cause the cobalt to react with the underlying silicon comprises heating at a temperature between 700° C. and 900° C. for a period of from 4 seconds to 40 seconds.

13. The method in accordance with claim 12 wherein cobalt is deposited to form a layer approximately 60 to 80 nanometers thick.

14. The method in accordance with claim 13 including subsequent to removing the unreacted cobalt the step of forming a layer of conductive metal on the cobalt silicide.

* * * * *